United States Patent [19]

Kamgar et al.

[11] 4,364,779

[45] Dec. 21, 1982

[54] FABRICATION OF SEMICONDUCTOR DEVICES INCLUDING DOUBLE ANNEALING STEPS FOR RADIATION HARDENING

[75] Inventors: Avid Kamgar, Millington; Ashok K. Sinha, New Providence, both of N.J.

[73] Assignee: Bell Telephone Laboratories, Incorporated, Murray Hill, N.J.

[21] Appl. No.: 175,055

[22] Filed: Aug. 4, 1980

[51] Int. Cl.³ .................... H01L 21/477; H01L 7/54
[52] U.S. Cl. .................................. 148/1.5; 148/187; 357/23; 357/91; 427/82
[58] Field of Search ............... 148/1.5, 187; 427/82; 357/91, 23

[56] References Cited

U.S. PATENT DOCUMENTS

| | | | |
|---|---|---|---|
| 3,615,873 | 10/1971 | Sluss, Jr. ........................ | 148/1.5 |
| 3,849,204 | 11/1974 | Fowler ........................... | 148/1.5 |
| 3,923,559 | 12/1975 | Sinha ............................. | 148/1.5 |
| 4,113,514 | 9/1978 | Pankove et al. ................ | 148/187 |
| 4,151,007 | 4/1979 | Levinstein et al. ............. | 148/1.5 |
| 4,154,873 | 5/1979 | Hickox et al. .................. | 427/82 |
| 4,184,896 | 1/1980 | Millea ............................ | 357/52 |

OTHER PUBLICATIONS

Revesz, J. Electrochem. Soc., 124 (11), (1977), pp. 1811–1813.
Fahrner, J. Electrochem. Soc., 121 (6), (1974), pp. 784–787.
Velchev et al., Radiation Effects, 41, (1979), pp. 99–106.

Primary Examiner—Upendra Roy
Attorney, Agent, or Firm—David I. Caplan

[57] ABSTRACT

A silicon device can be made more resistant to the destructive effects of ionizing radiation by a double annealing; the first annealing to a temperature of the order of 400 degrees C. in hydrogen, the second annealing also to a temperature of 400 degrees C. at a time when the device is not sealed against escape of hydrogen.

20 Claims, 8 Drawing Figures

FABRICATION OF SEMICONDUCTOR DEVICES INCLUDING DOUBLE ANNEALING STEPS FOR RADIATION HARDENING

FIELD OF THE INVENTION

This invention relates to the field of semiconductor apparatus and more particularly to methods for manufacturing semiconductor devices.

BACKGROUND OF THE INVENTION

It is known in the semiconductor device art, particularly the art of MOS (metal-oxide-semiconductor) devices, that nuclear radiation produces undesirable effects on device operation. More specifically, exposure of an MOS capacitor device to gamma rays produces an undesirable shift of the flatband voltage, ordinarily a shift of negative polarity; and exposure of a MOSFET (field effect transistor) device to these gamma rays produces a corresponding undesirable shift in the transistor threshold voltage. Thus, gamma ray dosages of as low as about $10^5$ radiation units (rads) ordinarily destroy the device operation of transistor devices integrated in a given monocrystalline silicon semiconductor body, by producing a threshold voltage shift of 100% or more. It therefore would be desirable to have a method for making semiconductor devices less sensitive to nuclear radiation; that is, a method for radiation hardening of these devices.

SUMMARY OF THE INVENTION

Our method for radiation hardening of semiconductor devices involves a double annealing (by heating) technique, in which at least the second annealing step is performed at a time when the devices are not sealed against the escape of hydrogen. More specifically, this invention is for a method of manufacturing a silicon semiconductor device in which the semiconductor is heated to a first elevated temperature and exposed to a hydrogen-containing ambient, cooled in such an ambient to a lower temperature such as room temperature, and then heated to a second elevated temperature, CHARACTERIZED IN THAT the device is pervious to hydrogen during a time interval while at said second temperature.

BRIEF DESCRIPTION OF THE DRAWINGS

This invention, together with its features, objects, and advantages, may be better understood from the following detailed description when read in conjunction with the drawing in which.

Only for the sake of clarity, none of the drawings is to scale. It should be understood that, although the drawings illustrate only a single device which is being manufactured, many such similar devices are ordinarily manufactured in the same semiconductor crystal body.

DETAILED DESCRIPTION

Figure 1:
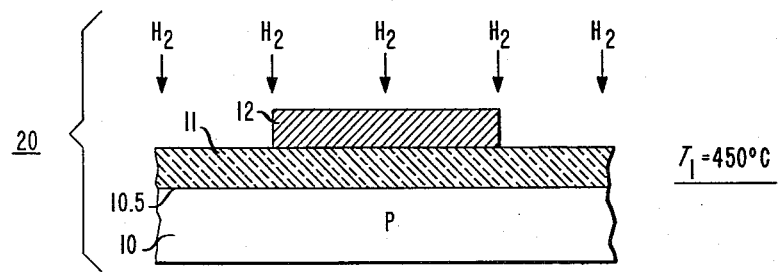
FIGS. 1 through 4 depict a silicon MOS capacitor device in cross section during illustrative successive stages of fabrication in accordance with one specific embodiment of the invention.

Referring to FIG. 1, an MOS capacitor device 20 is formed by an electrode layer 12, a silicon dioxide layer 11, and a monocrystalline semiconductor body 10 having a major surface 10.5. This body 10 is typically P-type silicon having a substantially uniform bulk resistivity of the order of 10 ohm-cm, typically in the range of about 5 to 10 ohm-cm. The silicon dioxide layer 11 is typically a dry or steam, thermally grown layer of thickness in the range of about 100 to 1500 Angstrom, typically about 500 Angstrom. The growth temperature for dry grown oxide is in the range of about 900 degrees C. to 1100 degrees C., typically about 1000 degrees C.; and the growth temperature for steam grown oxide being in the range of about 900 degrees C. to 1000 degrees C., typically about 950 degrees C. This thermally grown oxide layer 11 will serve as the dielectric for the MOS capacitor device being fabricated. The electrode layer 12 serves as the top metal plate of this capacitor. Typically, the electrode layer 12 is aluminum, aluminum on tantalum silicide, or aluminum on polycrystalline silicon, typically in the form of a circular cylinder about 0.020 inches in diameter. For example, a layer of aluminum of thickness about 7000 Angstrom is deposited uniformly, typically by evaporation, onto the top surface of the oxide layer 11 and the thus deposited aluminum is then selectively etched to form tiny circular cylinders. Prior to the formation of the electrode layer 12, but ordinarily subsequent to the growth of the oxide layer 11, an acceptor impurity, such as boron, may be introduced into the body 10 at its major surface 10.5—by ion implantation, for example—in order to provide an appropriate electrical conductivity at the surface 10.5 of the body 10. For example, a dose of about $10^{12}$ cm$^{-2}$ of about 35 keV boron ions followed by a 60-minute anneal in nitrogen at about 900 degrees C. can be introduced at the major surface 10.5 of the silicon body 10 through the oxide layer 11.

Figure 2:
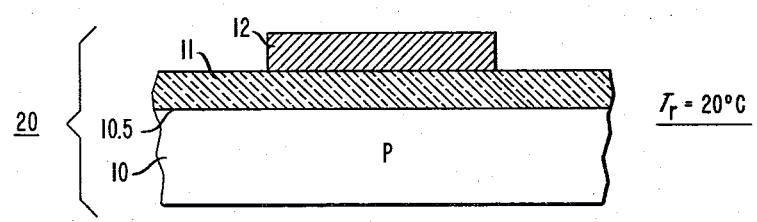
Figure 3:
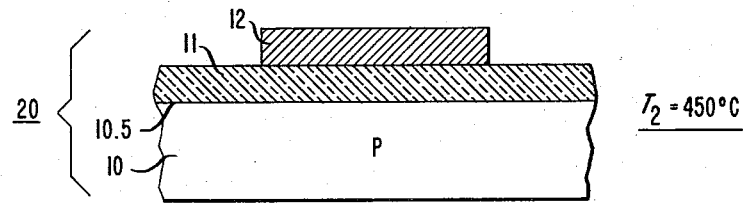

The body 10 together with its oxide 11 and the electrode 12 form the MOS capacitor device 20. In order to provide radiation hardening, this device is annealed by being heated to a first-elevated temperature $T_1$ in the range of about 300 degrees C. to 450 degrees C. or more, typically about 450 degrees C., in an ambient atmosphere containing hydrogen atoms or molecules. For example, the device is exposed to an ambient of a flowing stream of pure hydrogen gas at atmospheric pressure or thereabouts. Typically, the device 20 is held in this hydrogen atmosphere at this first temperature $T_1$ for a time interval dt, in the range of about half an hour to an hour or more. Then (FIG. 2) the device 20 is cooled to a lower temperature $T_R$ at a moderate cooling rate in the ambient atmosphere of flowing $H_2$, for example, during a time interval in the range of about 1 minute to 20 minutes, typically about 10 minutes. This lower temperature $T_R$ is typically room temperature of about 20 degrees C., but can be as high as about 60 or 80 degrees C. Next, (FIG. 3), the device 20 is again annealed, by being heated to a second elevated temperature $T_2$ in the range of about 300 degrees C. to 450 degrees C. or more, typically about 450 degrees C. However, the ambient atmosphere can now (FIG. 3) be different from that employed previously (FIG. 1). More specifically, the ambient atmosphere can now (FIG. 3) be, for example, pure nitrogen, pure hydrogen or a mixture thereof such as nitrogen mixed with 15% hydrogen ("forming gas") at atmospheric pressure. Then the device 20 in this ambient is cooled, for a second time, back to room temperature $T_R$ at a moderate cooling rate.

Figure 4:
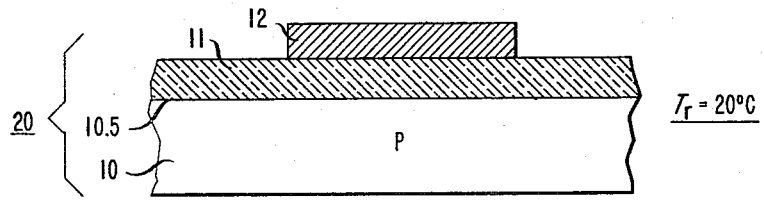

After cooling the device 20 back to room temperature $T_R$ for the second time (FIG. 4), the device 20 is significantly more resistant to gamma radiation than after the first cooling (FIG. 2); for example, the flatband voltage shift caused by a megarad of gamma rays is reduced from about 4.5 volt to about 1.0 volt, corresponding to a reduction in added surface charges $Q_{ss}$ from about $18 \times 10^{11}$ cm$^{-2}$ to about $4 \times 10^{11}$ cm$^{-2}$. It is believed that this reduction in surface charge is caused by the bonding of hydrogen to silicon at the oxide interface during the first annealing (FIGS. 1 and 2) and the unbonding of the hydrogen during the second annealing (FIGS. 2 and 3), leaving the silicon-oxygen bonds thereat in a more stable condition. However, it should be understood that the invention does not depend upon this theory.

It should be noted that both the first and second annealing are performed when the device is not sealed against the introduction or excape of hydrogen to or from the silicon body, the oxide layer being pervious to hydrogen. It should also be noted that after cooling the device 20 back to room temperature subsequent to the second heating step (FIG. 4), the device 20 is preferably never again heated above about 500 degrees C. during any further processing, if any. Thus, ordinarily it is preferable to perform the second, if not also the first, annealing after metallization of interconnections.

Figure 5:
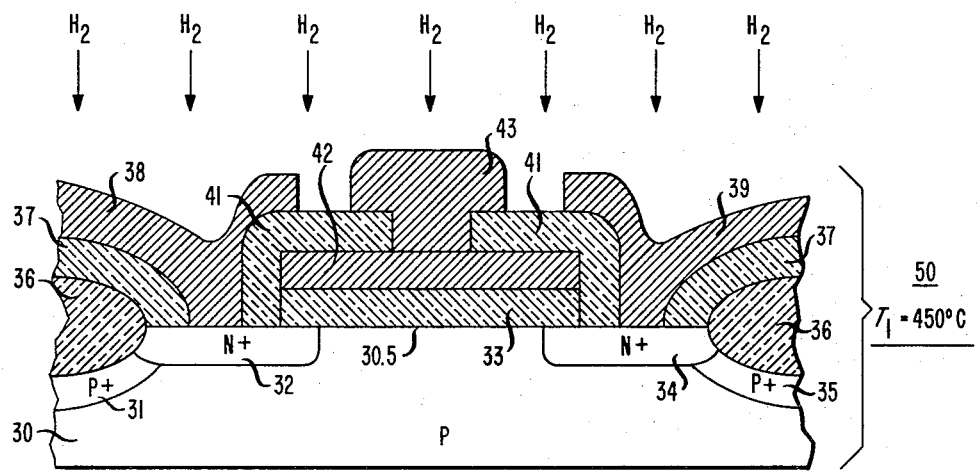
FIGS. 5 through 8 depict a silicon MOSFET device in cross section during illustrative successive stages of fabrication in accordance with another specific embodiment of the invention.

Referring to FIG. 5 illustrating a MOSFET device 50, a silicon dioxide layer 33 coats a portion of a major surface 30.5 of a monocrystalline semiconductor body 30. This body 30 is typically P-type silicon having a substantially uniform electrical conductivity, the same as that for the above-described body 10, except for N+ source and drain regions 32 and 33, respectively, and P+ channel stopping surface layers or regions 31 and 35. The silicon dioxide layer 33 is similar to the previously described oxide layer 11 and is of gate oxide quality suitable for MOSFET devices. A gate electrode layer 42 is ordinarily essentially a layer of polycrystalline silicon (poly-silicon) of thickness in the range of about 3000 to 5000 Angstrom, typically about 3500 Angstrom, or a composite layer of 2500 Angstrom polysilicon followed by 2500 Angstrom of TeSi$_2$. Source and drain electrodes 38 and 39, respectively, typically metallization comprising aluminum, provide electrical access to the source and drain; and an aluminum metallization electrode 43 provides electrical access to the gate electrode 42. Insulating layers 37 and 41, typically of 6% phosphosilicate glass of thickness typically of the order of 10,000 Angstrom, provide insulation of the source and drain electrodes and the gate electrode, respectively, from the semiconductor body 30 and from one another.

It should be noted that, because no layer of silicon nitride or other material impervious to hydrogen is present to seal the device 50, hydrogen can diffuse in and out of the silicon body 30 through the phosphosilicate glass.

Figure 6:
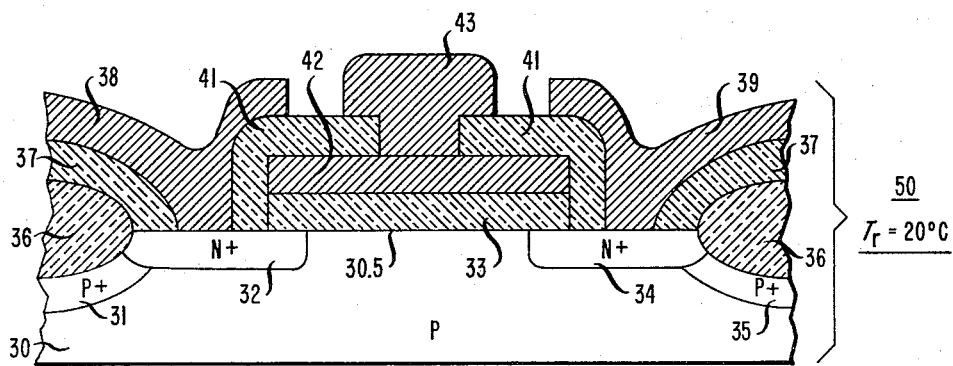
Figure 7:
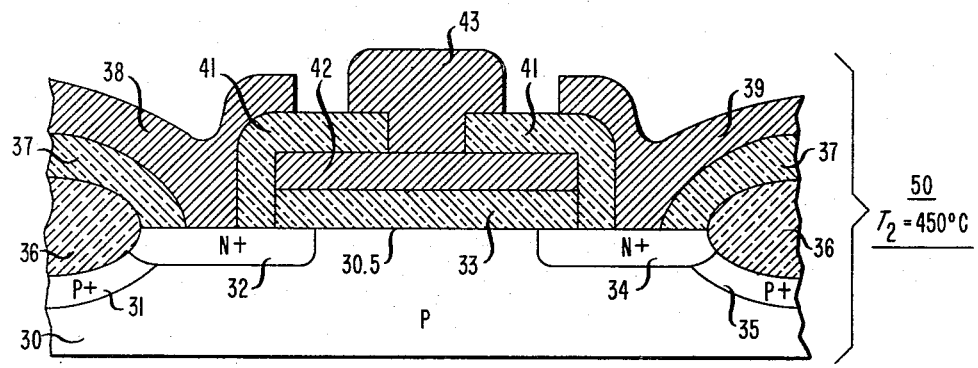
Figure 8:
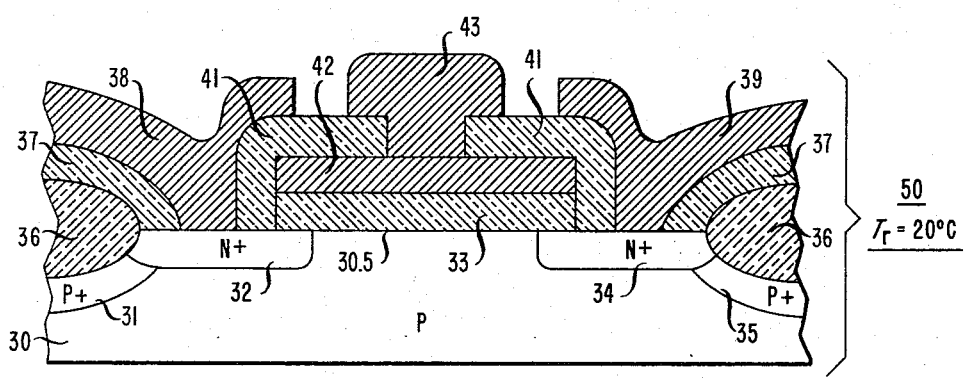

In order to provide radiation hardening of the MOSFET device 50, the device 50 is successively annealed by being heated to $T_1$ (FIG. 5), cooled to room temperature $T_R$ (FIG. 6) or thereabouts, again heated to $T_2$ (FIG. 7), and then cooled to room temperature (FIG. 8). These heating and cooling steps are done in the same manner with the same parameters as described above in connection with radiation hardening of the MOS capacitor device 20.

Again it should be noted that ordinarily it is preferable to perform the second, if not also the first, of these annealing steps after completion of the usual integrated circuit metallization of electrical interconnections of devices; that is, after completion of fabrication of the aluminum metallization electrode 43, as well as source and drain electrodes 38 and 39 together with their interconnections, typically of aluminum, with other devices (not shown) integrated on the same major surface 30.5 of the body 30.

Although the invention has been described in terms of specific embodiments, various modifications may be made without departing from the scope of the invention. For example, the ambient atmosphere used during the second heating (at $T_2$) can contain some, or merely traces of, H$_2$ and/or H$_2$O, i.e., hydrogen in some form. In this regard, it should be understood that traces of moisture, particularly on aluminum electrodes, can furnish hydrogen during the second heating; on the other hand, hydrogen in any form may not be necessary during the second heating or cooling steps. Moreover, the inventive steps can be applied to other than MOS devices.

We claim:

1. A process for manufacturing a silicon semiconductor device in which the semiconductor is heated to a first elevated temperature and exposed to an ambient containing hydrogen, cooled in said ambient to a lower temperature, and then heated to a second elevated temperature, CHRACTERIZED IN THAT the device is pervious to hydrogen during a time interval while being cooled to said lower temperature.

2. The process of claim 1 in which said second temperature is in the range of about 300 degrees C. to 450 degrees C., and said lower temperature is in the range of about 20 to 80 degrees C.

3. The process of claim 1 in which said first temperature is in the range of about 300 degrees C. to 450 degrees C., and said lower temperature is in the range of about 20 to 80 degrees C.

4. The process of claim 3 in which said second temperature is in the range of about 300 degrees C. to 450 degrees C., and said lower temperature is in the range of about 20 to 60 degrees C.

5. The process of claim 1, 2, 3, or 4 in which the semiconductor is silicon.

6. The process of claim 5 in which the device is an MOS device.

7. The process of claim 6 in which the device at said second temperature is exposed to an ambient that contains hydrogen.

8. In a process for manufacturing a semiconductive silicon device, the steps of:
    (a) heating the device to a first predetermined temperature;
    (b) cooling said device in the presence of hydrogen to a second, lower temperature; and,
    (c) heating said device to a third predetermined temperature, higher than the second temperature, and, maintaining the body at the third temperature, during a time interval when the device is not sealed against the escape of hydrogen therefrom.

9. The process of claim 8 in which the second temperature is in the range of about 20 to 60 degrees C.

10. The process of claim 8 in which said third temperature is in the range of about 300 degrees C. to 450 degrees C.

11. The process of claim 8, 9, or 10 in which said first temperature is in the range of 250 degrees C. to 450 degrees C.

12. The process of claim 11 in which said device is an MOS device.

13. The process of claim 12 in which the device during step (c) is exposed to an ambient that contains hydrogen.

14. A process for making a plurality of semiconductor transistor devices (50) integrated on a major surface (30.5) of a silicon body (30) comprising successively performing each of steps (a) through (c) of claim 8 simultaneously on all devices of said plurality after said devices have been electrically interconnected by metallization.

15. The process of claim 14 in which the second temperature is in the range of about 20 to 80 degrees C.

16. The process of claim 14 in which the third temperature is in the range of about 250 degrees C. to 450 degrees C.

17. The process of claim 14, 15, or 16 in which said first temperature is in the range of 250 degrees C. to 450 degrees C.

18. The process of claim 17 in which said second temperature is about 20 degrees C.

19. The process of claim 16 in which the devices are exposed during step (c) to an ambient that contains hydrogen.

20. The process of claim 18 in which the devices are exposed during step (c) to an ambient that contains hydrogen.

* * * * *